United States Patent [19]

Bertolet et al.

[11] Patent Number: 5,671,432

[45] Date of Patent: Sep. 23, 1997

[54] PROGRAMMABLE ARRAY I/O-ROUTING RESOURCE

[75] Inventors: Allan Robert Bertolet, Williston, Vt.; Kenneth Ferguson, Edinburgh, Scotland; Scott Whitney Gould, South Burlington, Vt.; Eric Ernest Millham, St. George, Vt.; Ronald Raymond Palmer, Westford, Vt.; Brian Worth, Milton, Vt.; Terrance John Zittritsch, Williston, Vt.

[73] Assignees: International Business Machines Corporation, Armonk, N.Y.; Cadence Design Systems, Inc., San Jose, Calif.

[21] Appl. No.: 460,420

[22] Filed: Jun. 2, 1995

[51] Int. Cl.[6] .............................. G06F 13/20; G06F 13/40
[52] U.S. Cl. ........................ 395/800; 395/311; 395/297; 395/309; 326/56; 364/489
[58] Field of Search ...................... 395/800, 312, 395/500, 200.17, 850, 280, 200.01, 578, 309, 200.16, 297, 311, 183.06; 364/DIG. 1, DIG. 2, 489, 488; 326/38, 56, 41, 40, 39; 365/230.05, 189.08, 230.06, 189.03, 185.17; 340/825.83

[56] References Cited

U.S. PATENT DOCUMENTS

| | | | |
|---|---|---|---|
| Re. 34,363 | 8/1993 | Freeman | 326/38 |
| 4,609,986 | 9/1986 | Hartmann et al. | 364/DIG. 1 |
| 4,617,479 | 10/1986 | Hartmann et al. | 365/185.17 |
| 4,642,487 | 2/1987 | Carter | 326/41 |
| 4,757,477 | 7/1988 | Nagayama | 365/230.05 |
| 4,758,745 | 7/1988 | Elgamal et al. | 326/16 |
| 4,774,421 | 9/1988 | Hartmann et al. | 365/185.17 |
| 4,896,296 | 1/1990 | Turner et al. | 326/38 |
| 4,924,440 | 5/1990 | Tanoi | 365/189.08 |
| 5,055,718 | 10/1991 | Galbraith et al. | 326/46 |
| 5,073,729 | 12/1991 | Greene et al. | 326/47 |
| 5,105,388 | 4/1992 | Itano et al. | 365/189.08 |
| 5,140,193 | 8/1992 | Freeman | 326/39 |
| 5,144,166 | 9/1992 | Camarota et al. | 326/41 |
| 5,208,491 | 5/1993 | Ebeling et al. | 326/41 |
| 5,221,865 | 6/1993 | Phillips et al. | 326/86 |
| 5,231,588 | 7/1993 | Agrawal et al. | 326/41 |
| 5,233,539 | 8/1993 | Agrawal et al. | 364/489 |
| 5,245,227 | 9/1993 | Furtek et al. | 326/38 |
| 5,245,583 | 9/1993 | Li et al. | 365/230.06 |
| 5,255,221 | 10/1993 | Hill | 365/189.08 |
| 5,282,271 | 1/1994 | Hsieh et al. | 395/872 |
| 5,311,080 | 5/1994 | Britton et al. | 326/40 |
| 5,317,698 | 5/1994 | Chan | 395/306 |
| 5,319,254 | 6/1994 | Goetting | 326/21 |
| 5,329,180 | 7/1994 | Popli et al. | 326/39 |
| 5,329,460 | 7/1994 | Agrawal et al. | 364/489 |
| 5,424,589 | 6/1995 | Dobbelaere et al. | 326/41 |

OTHER PUBLICATIONS

Payton, M., "The Motorola FPGA," Briefing, 22 pgs., dated Sep. 14, 1993.

Motorola, "Product Brief, MPA10xx Field Programmable Gate Arrays," dated Sep. 27, 1993.

*Primary Examiner*—Daniel H. Pan
*Attorney, Agent, or Firm*—Heslin & Rothenberg, P.C.

[57] ABSTRACT

A programmable array having programmable logic cells, a programmable interconnect network and a programmable I/O system. Two I/O interfaces are provided for respective logic cells about the perimeter of the array. The I/O interfaces comprise input, output and enable paths. Each of these paths has an associated multiplexer. An I/O routing network is positioned about the perimeter of the array. Conductors connecting the I/O interface multiplexers to the programmable interconnect network also intersect, and can be programmably connected to, buses of the I/O routing network.

38 Claims, 8 Drawing Sheets fig. 1 fig. 2 fig. 3 fig. 4 fig. 5 fig. 6 fig. 7 fig. 8

PROGRAMMABLE ARRAY I/O-ROUTING RESOURCE

RELATED APPLICATION INFORMATION

This application relates to commonly owned concurrently filed U.S. patent applications:

1. Ser. No.: 08/459,579, filed Jun. 2, 1995, now U.S. Pat. No. 5,631,578, Docket No.: BU9-95-025, entitled "PROGRAMMABLE ARRAY INTERCONNECT NETWORK;"
2. Ser. No.: 08/460,481, filed Jun. 2, 1995, Docket No.: BU9-95-019, entitled "PROGRAMMABLE LOGIC CELL;" and
3. Ser. No.: 08/459,156, filed Jun. 2, 1995, Docket No.: BU9-95-024, entitled "PROGRAMMABLE ARRAY CLOCK/RESET RESOURCE."

The section entitled "Description of the Preferred Embodiment(s)," and the drawings, from each of the above-referenced related U.S. patent applications are hereby expressly incorporated herein by reference.

TECHNICAL FIELD

This invention relates in general to integrated circuit devices, and, more specifically, to programmable integrated circuit devices having a plurality of programmable logic cells, a programmable interconnection network, and a programmable I/O network.

BACKGROUND OF THE INVENTION

Programmable integrated circuits are known in the art and include programmable logic devices ("PLDS"), Programmable Array Logic ("PALs"), and Programmable Logic Arrays ("PLAs"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA"), wherein the configuration can be effected by a user, in the "field." Such configuration may be effected by using electrically programmable fusible links, antifuses, memory-controlled transistors, floating gate transistors, or the like.

Advances in integrated circuit technology are providing the opportunity to add an ever-increasing number of cells to a programmable array. The densification of the array and the resulting increased functionality inevitably lead to requirements for advanced input/output ("I/O") circuitry. Conventional approaches to programmable array I/O have certain deficiencies.

In one conventional programmable array arrangement, logic cells positioned along the perimeter of the array are committed to providing an interface between a single I/O terminal and the remainder of the array. This is generally a use of these cells for which they were not designed. The numerous resources of certain "high-function" cells are wasted if the cell as a whole is dedicated to an I/O function.

Further, routing a signal path between interior logic cells and the particular logic cell associated with a desired I/O terminal can present difficulties. For example, if a logic cell in a given array row is committed to the desired I/O terminal, the signal path must be aligned to that particular logic cell. This is a routing constraint that adversely affects the overall flexibility of the array.

What is required, therefore, is an I/O system which provides advanced I/O capability to satisfy the requirements related to higher logic cell densities. In addition, the I/O system should conserve the logic cell resources of the programmable array and provide additional, programmable routing alternatives near the perimeter of the array.

SUMMARY OF THE INVENTION

Briefly summarized, the present invention, in one aspect, comprises a programmable array having a plurality of programmable logic cells arrayed therein and a programmable interconnect network. The programmable interconnect network includes a first plurality of buses wherein selected buses of the first plurality of buses are connectable to ones of the plurality of logic cells. The first plurality of buses includes a plurality of switches, each switch of the plurality of switches for programmably providing signals between buses of the first plurality of buses. A first I/O interface is associated with a corresponding one of the plurality of logic cells, and includes a data output path, a data input path, a first multiplexer having an output connected to the data output path and a plurality of inputs, and a second multiplexer having an input connected to the data input path and a plurality of outputs. The I/O interface includes first and second I/O signal buses, the first I/O signal bus being connected between one of the switches of the first plurality of buses and one of the plurality of inputs to the first multiplexer, the second I/O signal bus being connected between one of the switches of the first plurality of buses and one of the plurality of outputs of the second multiplexer.

The programmable array may further include a plurality of I/O routing buses running proximate the first I/O interface, at least one of the plurality of I/O buses being programmably connectable to at least one of the first and second I/O signal buses of the first I/O interface. The programmable array may further include a programmable element connected between the at least one of the plurality of I/O buses and one of the first and second I/O signal buses of the first I/O interface. The plurality of I/O routing buses may run generally along a perimeter of the array.

The first I/O interface of the programmable array may further include an enable path such that array output signals can be controllably provided to an I/O terminal corresponding to the first I/O interface. The I/O interface further includes a third multiplexer having an output connected to the enable path and a plurality of inputs, and a third I/O signal bus, the third I/O signal bus being connected between one of the switches of the first plurality of buses and one of the plurality of inputs of the third multiplexer.

In another aspect of the invention, an I/O and interconnect system is provided for a programmable array having a plurality of programmable logic cells. The I/O and interconnect system comprises an I/O terminal, an I/O interface corresponding to the I/O terminal, and a first multiplexer.

The system further includes a general interconnect network for interconnecting a plurality of logic cells, the general interconnect network including a first plurality of parallel interconnect buses, the first plurality of parallel interconnect buses including a first extended bus connected to the first multiplexer of the I/O interface. The system further includes a plurality of perimeter buses running along the perimeter of the array, at least one of the plurality of perimeter buses being programmably connectable to the extended bus of the first plurality of parallel interconnect buses.

The I/O interface may further include an output path wherein the first multiplexer has an output connected to the output path, an input path, a second multiplexer wherein the second multiplexer has an input connected to the input path, an output enable path, and a third multiplexer wherein the third multiplexer has an output connected to the output enable path. The first plurality of parallel interconnect buses may further include second and third extended buses being connected to an output of the second and third multiplexers of the I/O interface, respectively. Selected buses of the plurality of perimeter buses are programmably connectable to a selected one of the first, second and third extended buses of the first plurality of parallel interconnect buses.

At least one of the plurality of programmable logic cells may include a direct connect output conductor connected to an input of the first multiplexer of the I/O interface, and a direct connect input conductor connected to the input path of the I/O interface. Each of the first, second and third extended buses of the first plurality of parallel interconnect buses may be connected to the first, second and third multiplexers of the I/O interface.

In yet another aspect of the invention, a programmable array is provided having a plurality of logic cells arranged in rows and columns therein including a plurality of perimeter logic cells. A programmable interconnect network is provided for interconnecting logic cells of the plurality of logic cells and comprises a plurality of buses, at least some of the plurality of buses being connectable to respective ones of the plurality of logic cells. The programmable array further comprises a routing network disposed at the perimeter of the array comprising a plurality of buses. A plurality of I/O interfaces are provided about the perimeter of the array such that each of a portion of the plurality of perimeter logic cells has two I/O interfaces corresponding thereto. A plurality of first conductors are provided for programmably connecting at least some of the plurality of I/O interfaces to corresponding logic cells about the perimeter of the array. A plurality of second conductors are provided for programmably connecting at least some of the plurality of I/O interfaces to corresponding ones of the plurality of buses of the programmable interconnect network, and a plurality of programmable connections for programmably connecting at least some of the plurality of buses of the routing network to at least some of the plurality of second conductors are also provided.

At least some of the plurality of I/O interfaces of the programmable array may include an output path, an input path and an output enable path. A first multiplexer is provided and is connected to the output enable path for programmably selecting signals from a first and second conductor corresponding to the respective I/O interface. A second multiplexer is provided and is connected to the output path for programmably selecting signals from a first and second conductor corresponding to the respective I/O interface. A third multiplexer is connected to the input path for programmably applying a signal from the input path to a respective one of the plurality of second conductors.

The routing network may comprise a plurality of programmable switches, at least some of the plurality of programmable switches being programmable to provide signals between respective ones of the plurality of buses of the routing network. In one embodiment, the routing network includes sixteen buses disposed about the entire perimeter of the array.

The present invention provides an enhanced I/O capability which satisfies requirements related to higher logic cells densities. The I/O system of the present invention conserves logic cell resources of the programmable array and provides additional, programmable routing alternatives near the perimeter of the array.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT(S)

Figure 1:
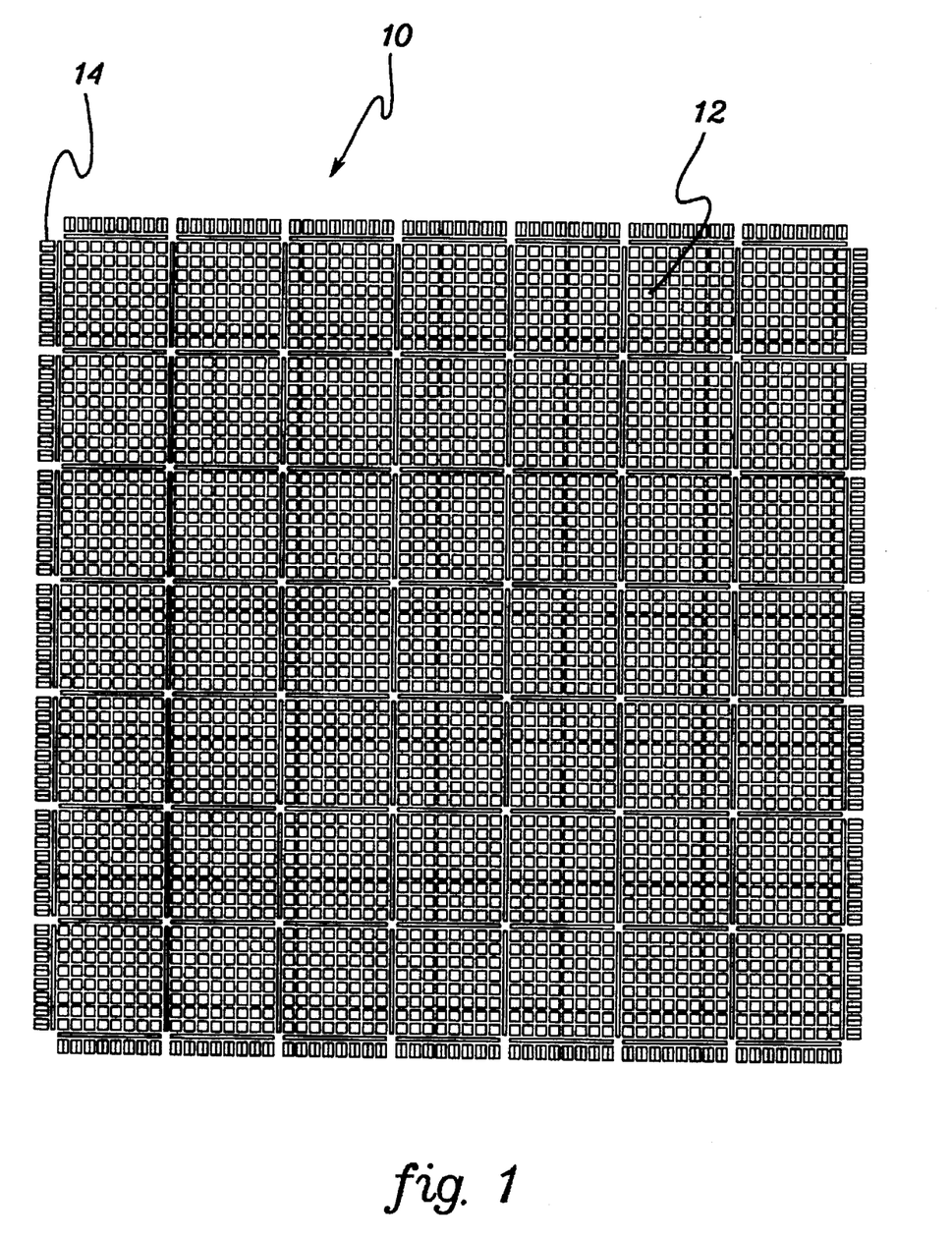
FIG. 1 depicts a programmable gate array having a plurality of programmable logic cells and a plurality of input/output interfaces provided pursuant to the principles of the present invention.

With reference to FIG. 1, there is shown a layout of an integrated circuit programmable gate array 10 comprising a plurality of programmable logic cells 12. In this particular embodiment, the plurality of programmable logic cells comprises a 56 ×56 array of cells divided into sectors of cells, wherein each sector is defined by an 8×8 group of cells. The programmable logic cells of the array can be implemented according to the above-incorporated portions of the U.S. patent application entitled "PROGRAMMABLE LOGIC CELL," or can be any type of known logic cells, including AND/OR macrocells as in PALs or PLAs. Also depicted are the input/output ("I/O") interfaces 14 along the perimeter of the array which are used for data input and output pursuant to the principles of the present invention. The position of the I/O interfaces is not necessarily limited to the perimeter of the array.

Figure 2:
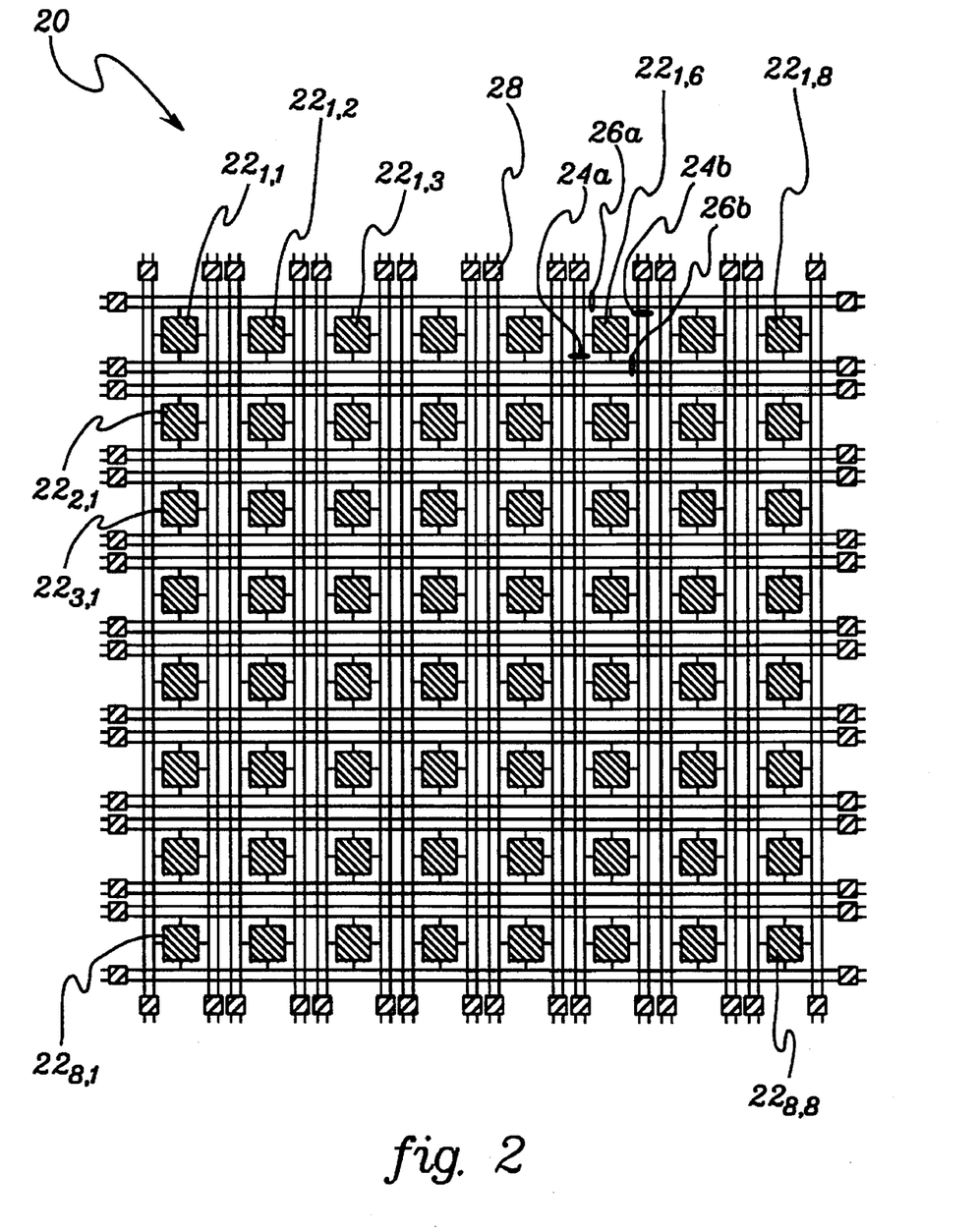
FIG. 2 depicts a portion of a programmable array having a plurality of programmable logic cells, and an interconnect network connecting the programmable logic cells.

With reference to FIG. 2, there is shown a single sector 20 of programmable logic cells of the array of FIG. 1. A single sector comprises logic cells $22_{1,1}$ to $22_{8,8}$. With reference to logic cell $22_{1,6}$, the cell is shown generally surrounded by vertical interconnect buses 24a and 24b, and horizontal interconnect buses 26a and 26b. These horizontal and vertical interconnect buses are positioned between each row and column of the array and provide connections between any two logic cells in the array, or between any logic cell in the array and the I/O interfaces. As used herein, a bus represents a single conductor or a group of conductors, generally co-linerally arranged, which may be interrupted by programmable interconnect elements or repeaters. The interconnect buses together form the overall programmable interconnect network of the programmable array. Programmable resources within the interconnect network may be provided in addition to those in the programmable logic cells. The programmable resources in the interconnect network may include, for example, switches 28 which allow signals to be selectively transmitted between two vertical buses. In addition, bus turns (not shown) may be employed to provide programmable interconnections between a specified vertical and a specified horizontal interconnect bus. The programmable interconnect network can be implemented according to the above-incorporated portions of the U.S. patent application entitled "PROGRAMMABLE ARRAY INTERCONNECT NETWORK."

Figure 3:
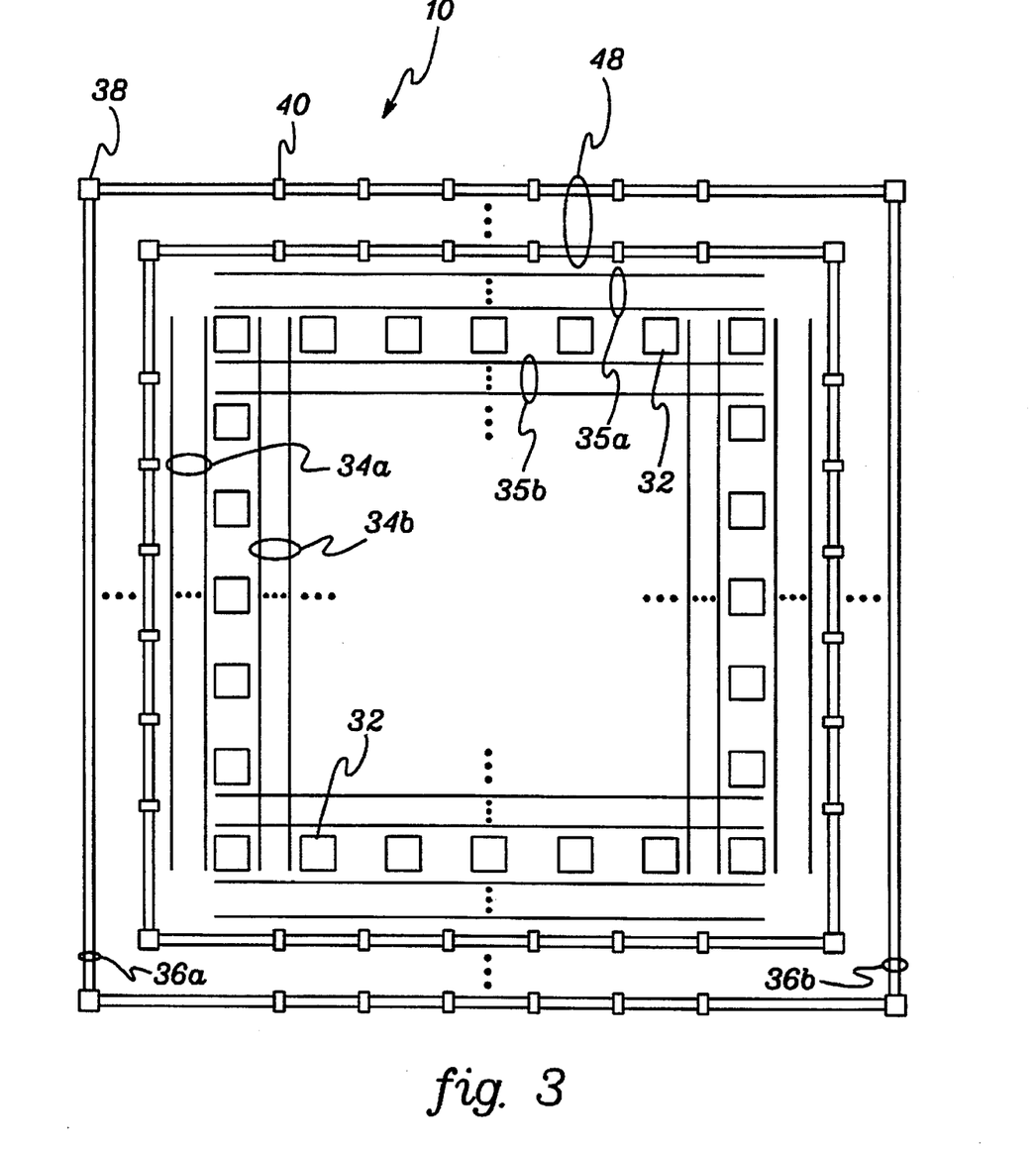
FIG. 3 depicts a programmable gate array having an I/O routing network disposed about the perimeter of the array pursuant to the principles of the present invention.

FIG. 3 depicts the programmable array 10 of FIG. 1, with certain inventive features thereof emphasized. As discussed above, the array 10 may comprise a 7×7 arrangement of sectors 32. (Each sector comprises an 8×8 arrangement of logic cells.) Also depicted are vertical interconnect buses 34a and 34b and horizontal interconnect buses 35a and 35b. These interconnect buses correspond to buses 24 of FIG. 2 for the perimeter rows and columns of logic cells of the array shown in FIG. 3. Pursuant to the principles of the present invention, in addition to interconnect buses 34 and 35, an I/O routing network comprising sets 48 of buses is provided at the perimeter of the array 10. Thus, an additional network of bussing is provided about the perimeter of the array. Programmable switches 38 and 40 can be placed at the corners or at the interior of the buses of the I/O routing network, respectively. The switches, as discussed further below, facilitate the communication between ones of the buses within the I/O routing network. Note also, as in the case of buses 36, that switches are not necessary, and that buses could span the entire array (or any portion thereof), uninterrupted. In a preferred embodiment, switches are provided for all of the buses at sector boundaries.

As discussed in detail below, the programmable I/O routing network of the present invention facilitates communication between interior logic cells, and between interior logic cells and the numerous I/O interfaces (not shown) disposed about the perimeter of the array.

Figure 4:
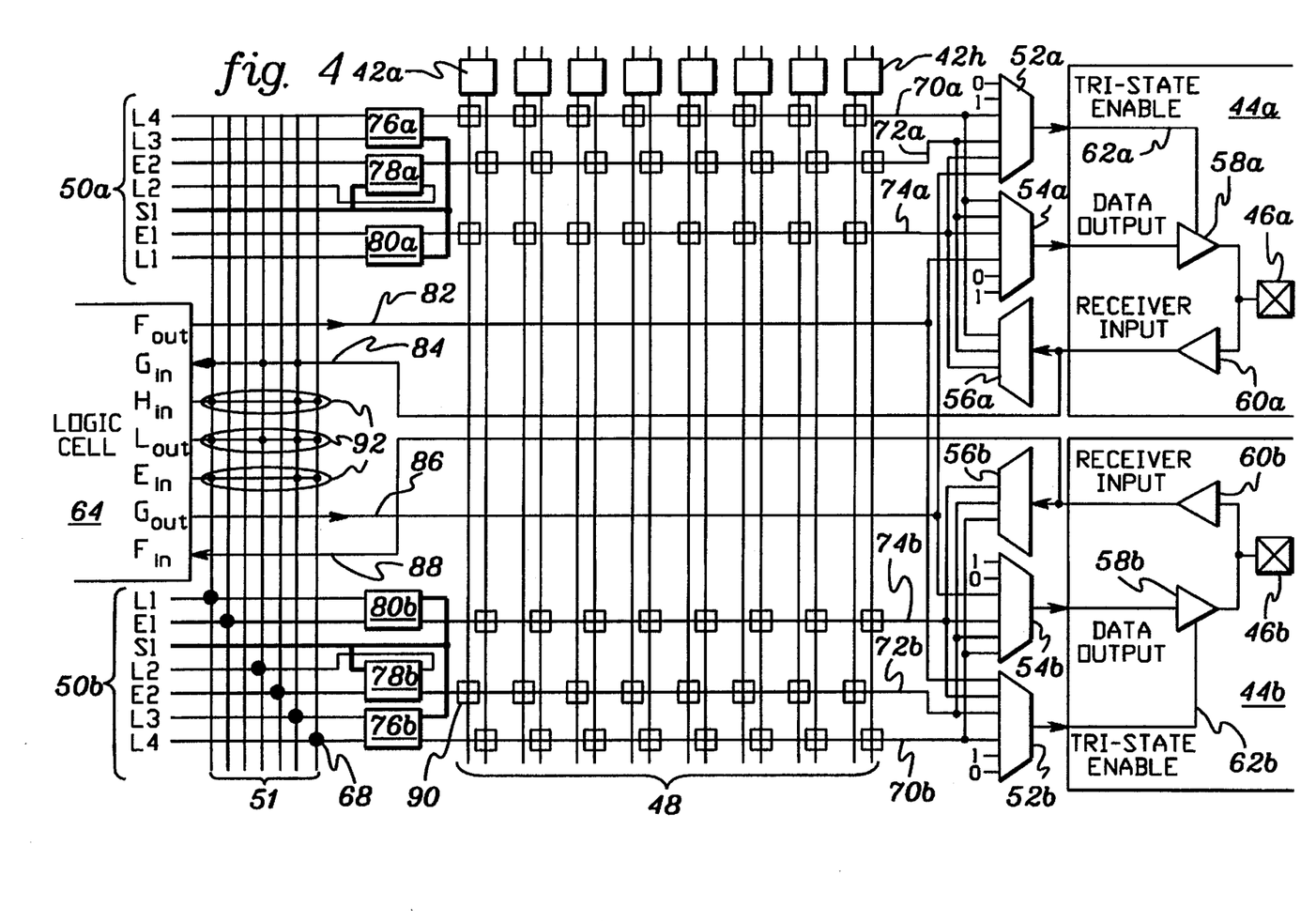
FIG. 4 depicts a perimeter logic cell, two associated I/O interfaces, and portions of the programmable interconnect network and the I/O routing network pursuant to the principles of the present invention.

FIG. 4 depicts a preferred embodiment of the invention in which a perimeter logic cell 64 has two I/O interfaces 44a and 44b associated therewith. Buses 50a, 50b and 51 comprise bus sets normally associated with the row and column of logic cell 64. Programmable connections or bus turns 68 can be provided between buses 51 and 50.

Pursuant to the principles of the present invention, and as discussed above, I/O routing buses 48 comprising an I/O routing network are disposed generally between the perimeter core cell 64 and the I/O interfaces 44a and 44b. Note that any arrangement of buses, i.e., in multiple metallization layers of an integrated circuit chip, would fall within the scope of the invention if the depicted connections and related functions are provided thereby. In the preferred embodiment, sixteen such buses are arranged in eight sets of two buses each, each set of buses having associated therewith periodic switching repeaters 42a–h for providing signals between the buses of each set. To facilitate communication between buses 48, buses 50a–b, and I/O interfaces 44a–b, horizontal I/O signal buses 70a–b, 72a–b, and 74a–b are provided and form intersections with buses 48. At selected intersections, programmable elements 90 (e.g., bus turns) are provided for selectively connecting one of the vertical buses 48 and a corresponding I/O signal bus. I/O signal buses 70, 72 and 74 can connect directly into the programmable interconnect network via switches 76a–b, 78a–b, and 80a–b, although the switches can be eliminated in other embodiments. In addition, connections to each respective I/O interface 44 are accomplished via multiplexers 52a–b, 54a–b, and 56a–b, as discussed below.

Each I/O interface 44 can comprise a respective terminal 46, enable path 62, output path using buffer 58, and input path using buffer 60. As used herein, the term "I/O" denotes an input capability, an output capability or both an input and an output capability. Those skilled in the art will recognize that any arbitrary combination of functions can be provided in such interfaces. Pursuant to the principles of the present invention, multiplexers 52, 54 and 56 provide a flexible signal selection scheme such that a signal on any of the respective buses 70, 72 and 74 can be provided to enable paths 62 or data output paths 58. In addition, any signal received at terminal 46 can be provided to any of the three respective buses 70, 72 and 74 via multiplexer 56. One advantage of this highly integrated connection between the interconnect buses 50 and the I/O interfaces 44 is that signals generated from interior cells in the logic array can be applied directly to the I/O interfaces about the perimeter of the array through buses 50 without passing through a perimeter logic cell. In addition, these same signals no longer require any particular alignment in the array since any one of the buses 48 can be employed to realign a signal at the perimeter of the array with the desired I/O interface.

It should be evident to one of ordinary skill in the art that there are numerous ways of providing the connections required in multiplexers 52, 54 and 56, intersections 90 and switches 42, 76, 78 and 80. For example, each intersection 90 could comprise a pass transistor, an EPROM, a fusible link or an antifuse which affects the desired isolation or connection between the conductors at the intersections. A user, upon requiring a connection at any particular intersection, would then only be required to perform the proper programming to effect the connection. A laser-programmed device could also employ optional welds at the intersection. The required connections are provided by either including or excluding the weld. A mask-programmed device would simply include or omit the relevant connections. Similarly, for the multiplexers 52, 54 and 56, similar methods of signal selection can be employed. Any structure for signal selection in which before programming, a plurality of signals are available for selection, and after programming, one of the signals is selected, is referred to herein as a multiplexer. A "connection," as used throughout herein, and unless otherwise expressly indicated, broadly denotes either a direct, conductive connection between conductors, or an indirect (e.g., buffered/inverted) interface in which the information from one conductor is nevertheless supplied to the other conductor. Similarly, an "input" or an "output" denotes either a direct or indirect (e.g., buffered/inverted) interface, unless otherwise expressly indicated.

In a presently preferred embodiment, pass gate multiplexers and bus turns are employed which are controlled by static random access memory ("SRAM") cells. The SRAM cells are directly or indirectly (through decoders) tied to the gates of the pass gates within a pass gate multiplexer, thus controlling the state of the pass gates. For example, the I/O interface 44a comprises multiplexer 52a. A single connection is routed from each potential input bus into the source/drain combination of a field effect transistor transmission gate, and the drain/source combination of the transmission gate is routed to the enable path 62a of the I/O interface. Six such transmission gates may be found in this 6:1 pass gate multiplexer and software and decoding logic of the programming system ensures that only one particular pass gate is connected to any single input node.

In addition to the connection provided between buses 50 and I/O interfaces 44, the two I/O interfaces depicted can also maintain connections via "direct connect" conductors to perimeter logic cell 64. These connections employ conductors 82, 84, 86 and 88. Thus, each perimeter logic cell maintains direct connections to its corresponding pair of I/O interfaces 44, in addition to at least a connection to the buses 51 of the programmable interconnect network via access points 92. Connections (not shown) to buses 50 are also provided for perimeter logic cell 64.

Figure 5:
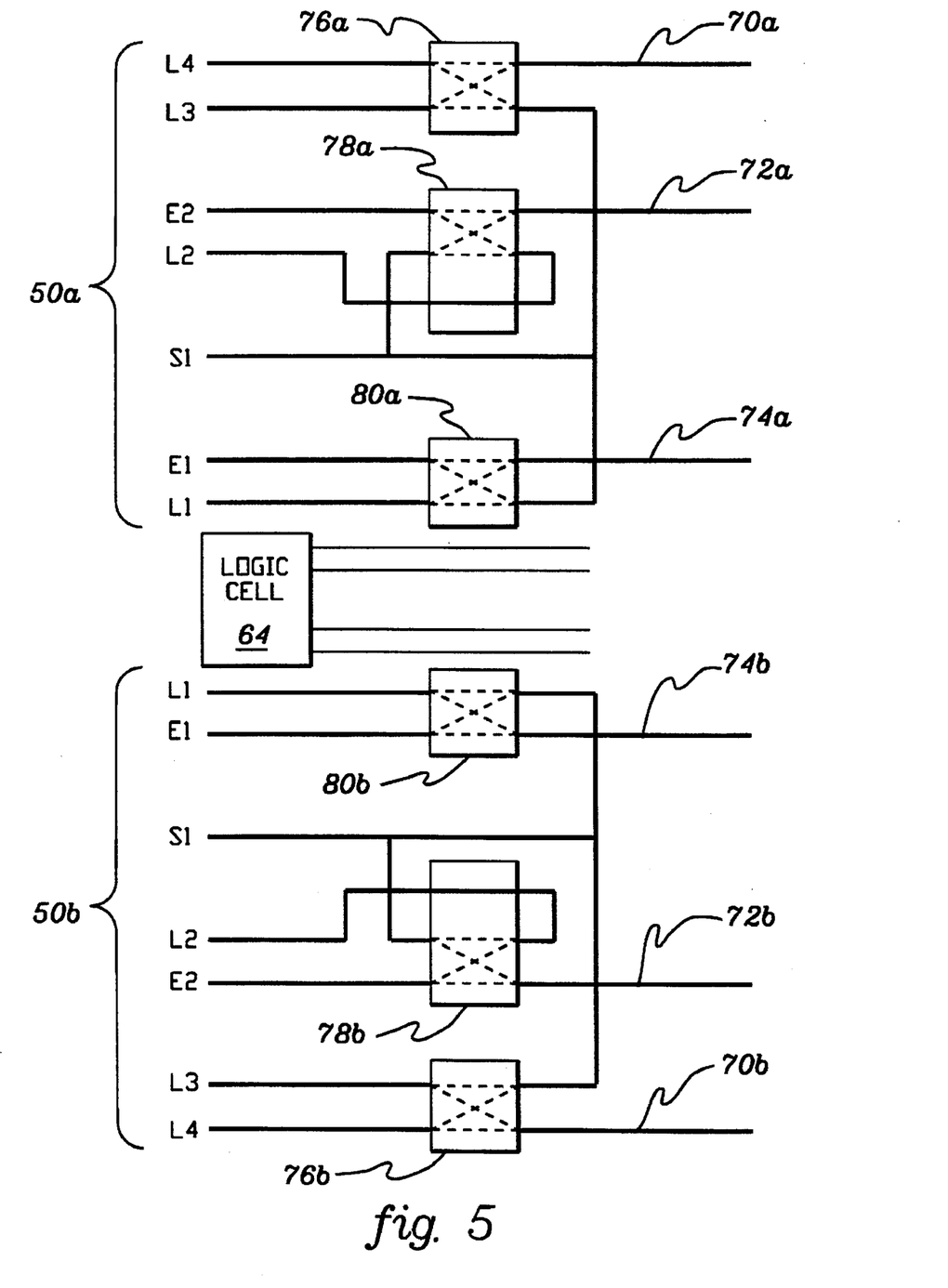
FIG. 5 depicts a portion of the programmable interconnect network, and the extended I/O signal conductors thereof, pursuant to the principles of the present invention.

FIG. 5 (in which like elements are indicated using like reference numerals) depicts additional detail of the interface of buses 50a–b of the programmable interconnect network and buses 70, 72 and 74 which connect to the I/O interface multiplexers. Buses within groups 50a and 50b comprise local ("L"), express ("E") or super ("S") buses. The uses of these buses within the array is described in detail in the above-incorporated portions of the U.S. patent application entitled "PROGRAMMABLE ARRAY INTERCONNECT NETWORK." Briefly, the local buses are employed to carry signals to and from logic cells. The express and super buses comprise longer length conductors and do not generally connect to logic cells, however, they can connect to the local buses via switches such as 78 and 80. The super buses span the entire length of the array, thereby offering a virtual terminal capability to the I/O terminal 46 via multiplexers 56, buses 72, and switches 78 (of FIG. 4).

In the preferred embodiment, a perimeter logic cell 64 has associated therewith two sets of buses 50a and 50b. Within each set near the perimeter, switches 76a–b, 78a–b and 80a–b are provided. In the preferred embodiment, these switches comprise switching repeaters in which a receive signal is buffered and redriven in a user-selected direction. A switching repeater is described in greater detail below with respect to FIG. 8. Near the perimeter of the array, ports of the switching repeaters are occupied by conductors 70, 72 and 74 which are applied to the perimeter I/O interfaces, and which form intersections with the buses 48 of the I/O routing network. Thus, signals on buses 50 can be provided either to the I/O interfaces, or to the I/O routing network via conductors 70, 72 and 74.

Figure 6:
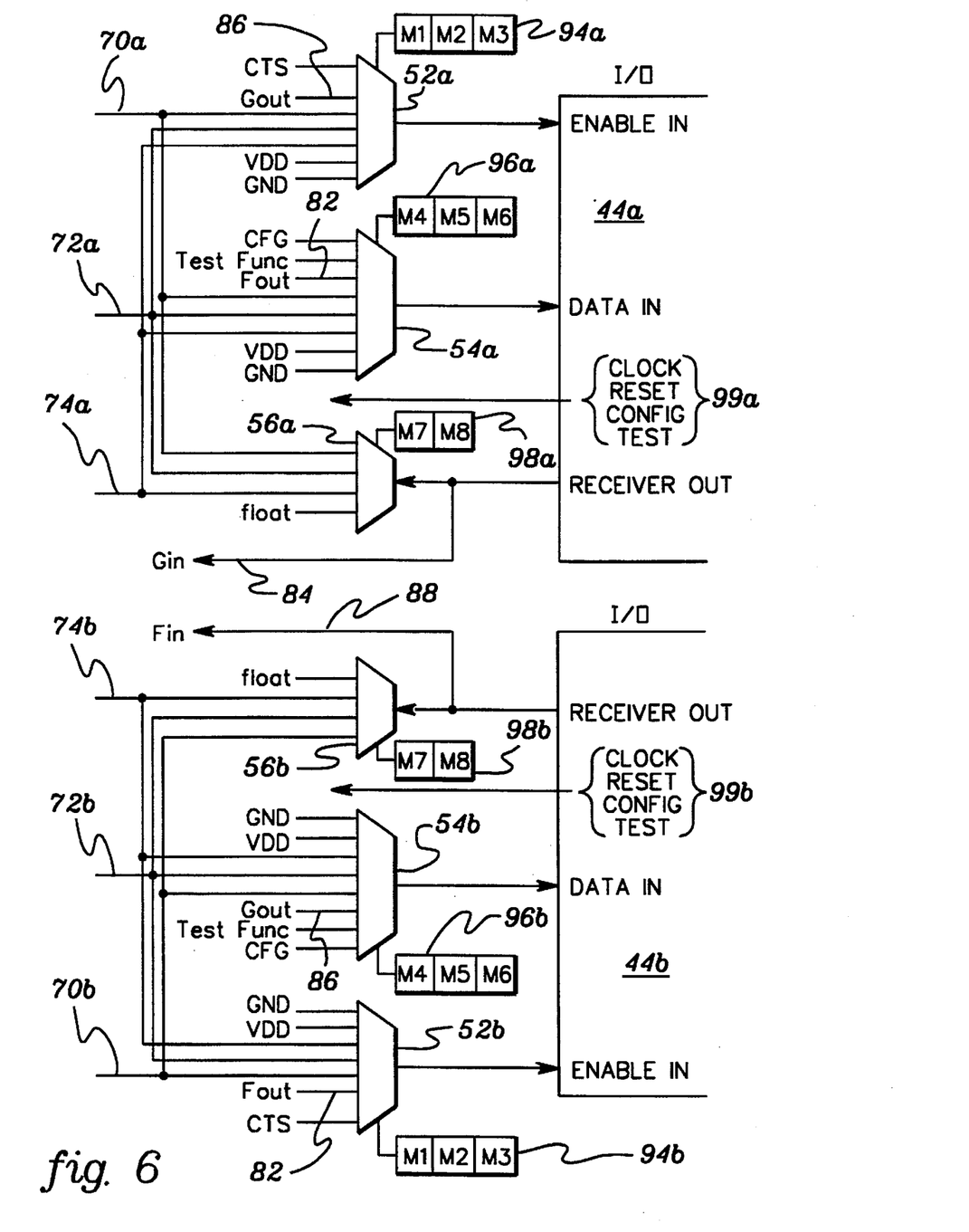
FIG. 6 depicts the multiplexing interface between the I/O interfaces and the I/O signal buses, pursuant to the principles of the present invention.

FIG. 6 (in which like elements are indicated by like reference numerals) depicts greater detail of the connections between conductors 70, 72 and 74 and I/O interfaces 44a and 44b. As discussed above, each of the three exemplary paths of each I/O interface (i.e., enable, data in, and receiver out) has associated therewith a respective multiplexer 52, 54 and 56. Conductors 70, 72 and 74 are each connected to each of the multiplexers pursuant to the principles of the present invention. In addition, direct connect conductors 82, 84, 86 and 88 are connected either to the multiplexers or directly to the receiver out data paths. These conductors run directly to the associated perimeter logic cell. It should be understood that any portion, possibly including all, of the perimeter logic cells may have the two I/O interfaces associated therewith, including the relevant connections. Similarly, any portion, possibly including all, of the I/O interfaces may be designed and connected as discussed above.

As discussed above, in the preferred embodiment, multiplexers 52, 54 and 56 are controlled using SRAM cells. These memory cells, 94, 96 and 98 (and designated M1–M8) are connected (directly or indirectly) to the select inputs of the multiplexers and contain user programming information.

Additional signals from FIG. 6 will be briefly explained. The CFG and CTS signals applied to the data and enable paths, respectively, provide configuration or test capability. The inputs 99 comprise clock, reset, config and test inputs which can also alternatively be processed by I/O interfaces 44.

Figure 7:
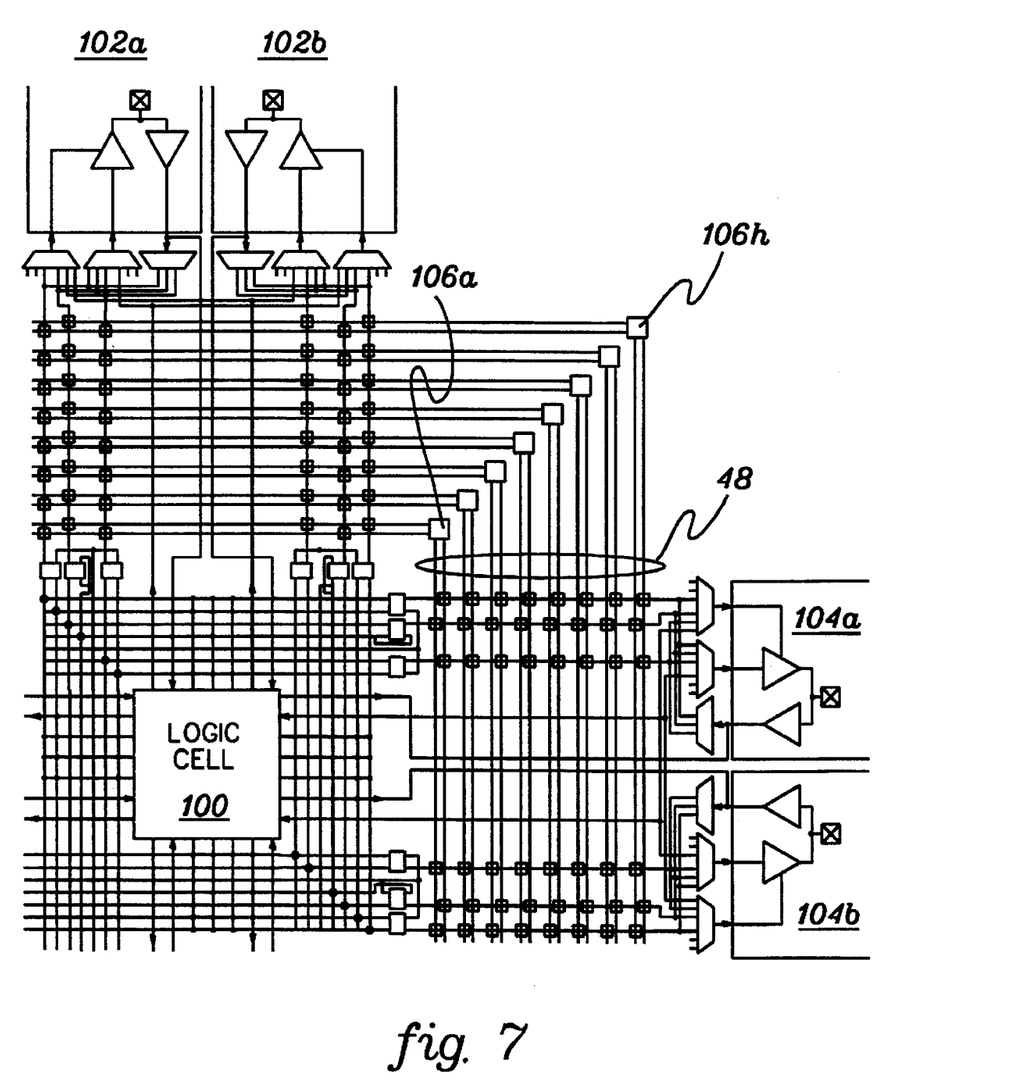
FIG. 7 depicts a corner of a programmable array having an I/O routing network pursuant to the principles of the present invention.

FIG. 7 depicts the conditions at any one of the four corners of the array. A perimeter logic cell 100 is depicted and has associated therewith I/O interfaces 102a and 102b, and 104a and 104b. The same connectivity can be provided for each of the I/O interfaces according to the discussions above regarding FIGS. 4–6. I/O routing network buses 48 are shown projecting toward the corner and the pattern of switches in each sector is, in fact, continued at the corner of the array. Switches 106–h are thus provided at the corners of the array pursuant to the principles of the present invention.

Figure 8:
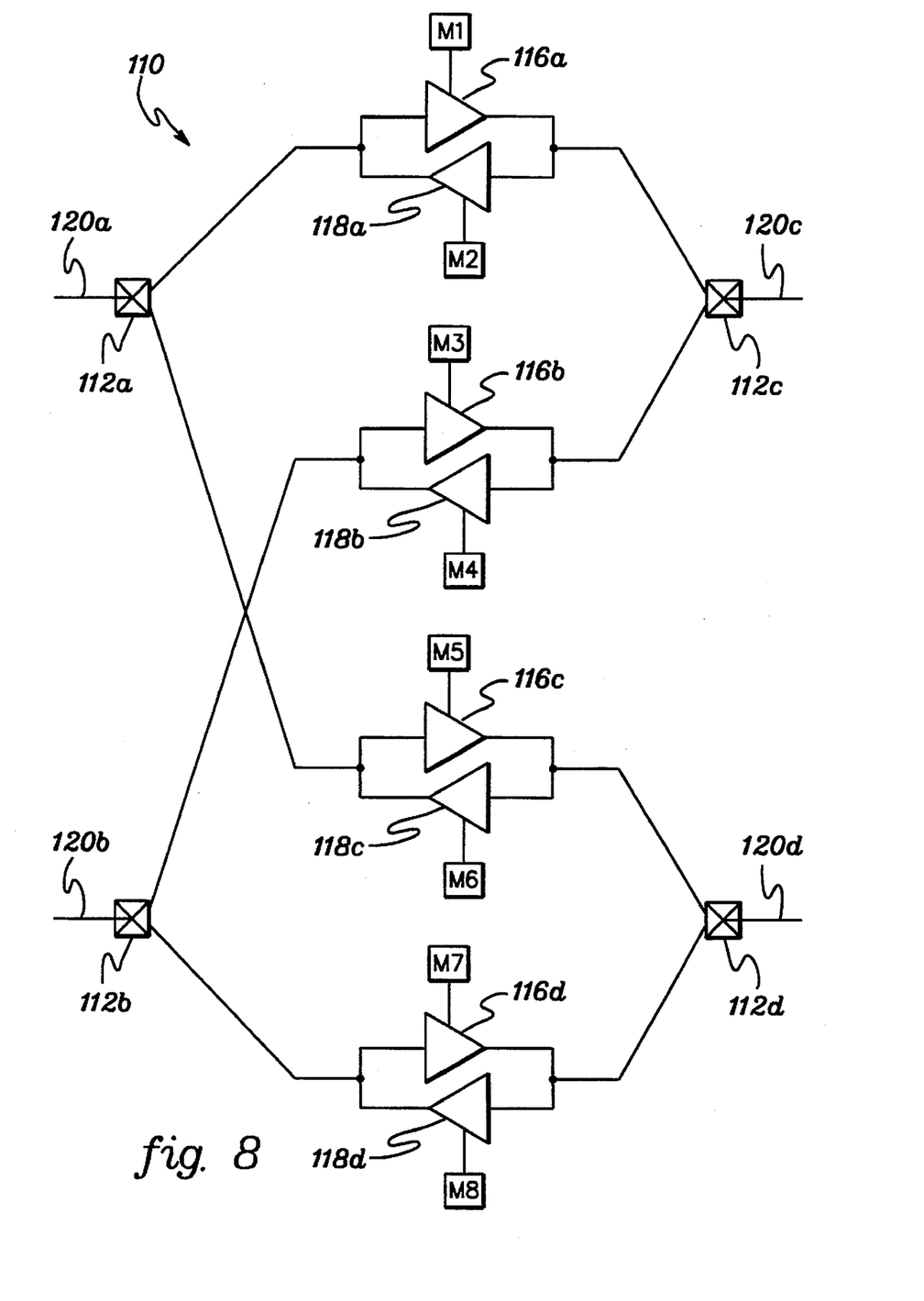
FIG. 8 depicts the structure of a switching repeater of the programmable interconnect network and the I/O routing network pursuant to the principles of the present invention.

FIG. 8 depicts a switching repeater 110 employed in the programmable interconnect network and the I/O routing network of a preferred embodiment of the present invention (for example, for switches 76, 78, 80 and 42 of FIG. 4). The switching repeater buffers and re-drives signals to/from lines 120a–d connected to ports 112a–d. In the preferred embodiment, directional tri-state buffers 116a–116d and 118a–118d are employed and are controlled by memory cells M1–M8. It will be apparent to one of ordinary skill in the art that an incoming signal on any one of the signal lines 120 can be applied to one, and possibly two, of the remaining signal lines 120. It is also possible that simple non-programmable buffers may be placed in series in any of the buses described above for signal amplification.

As discussed above, various technologies are known to those skilled in the art to provide array programmability. Any of these techniques, or variants thereof, can be used to program the array of the present invention. Mask programming techniques include customizing the deposition of the final layers of metallization of an otherwise generally designed integrated circuit (see, for example, U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTER-SLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURNAROUND TIME VLSI DEVELOPMENT HARDWARE," IEEE Journal of Solid-State Circuits, Vol. SC-16, No. 5, Oct., 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

As discussed above, programming the multiplexers, switching repeaters and bus turns of a preferred embodiment of the present invention involves SRAM cells, programmed by a user. FIGS. 6 and 8 depict preferred connections for SRAM cells M. The array SRAM cells can be configured in accordance with the techniques disclosed in the publication entitled "APPLICATION NOTE AT6000 SERIES CONFIGURATION," May 1993, Revision 1B, Atmel Corporation, which is hereby incorporated herein by reference in its entirety.

The present invention provides two flexible I/O interfaces per perimeter core cell, and each I/O interface includes a highly programmable multiplexing system for connecting to the general interconnect network, or to the corresponding perimeter core cell. In addition, an I/O routing network is provided having a plurality of switches, and which can be programmably connected to intersecting conductors.

I/O bound signals originating from the interior of the array can be simply routed to the nearest edge, and the I/O routing network of the present invention can be used to apply the signal to any of the numerous I/O interfaces. This signal routing thus increases routing flexibility and avoids the use of perimeter logic cells. Thus, the present invention satisfies the need for advanced I/O capability, conserves perimeter cell resources, and provides flexible routing alternatives about the perimeter of the array.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

What is claimed is:

1. A programmable array having a plurality of programmable logic cells arrayed therein, said programmable array further comprising:

a programmable interconnect network, the programmable interconnect network comprising a first plurality of buses wherein selected buses in the first plurality of buses are connectable to ones of the plurality of logic cells, the first plurality of buses including a plurality of switches, at least some switches of the plurality of switches for programmably providing signals between buses of the first plurality of buses; and a first I/O interface associated with a corresponding one of the plurality of logic cells, the first I/O interface comprising:

a data output path for carrying array output signals to an I/O terminal corresponding to the first I/O interface;

a data input path for carrying array input signals from the I/O terminal corresponding to the first I/O interface;

a first multiplexer having an output connected to said data output path, said first multiplexer further having a plurality of inputs;

a second multiplexer having an input connected to said data input path, said second multiplexer further having a plurality of outputs; and first and second I/O signal buses, the first I/O signal bus being connected between one of the switches of the first plurality of buses and one of the plurality of inputs of the first multiplexer, the second I/O signal bus being connected between one of the switches of the first plurality of buses and one of the plurality of outputs of the second multiplexer.

2. The programmable array of claim 1 further comprising:

a plurality of I/O routing buses, said plurality of I/O routing buses running proximate said first I/O interface, at least one of said plurality of I/O routing buses being programmably connectable to at least one of the first and second I/O signal buses of the first I/O interface.

3. The programmable array of claim 2 further comprising a programmable element connected between the at least one of said plurality of I/O routing buses and the at least one of the first and second I/O signal buses of the first I/O interface.

4. The programmable array of claim 2 wherein the plurality of I/O routing buses runs generally along a perimeter of the array.

5. The programmable array of claim 1 wherein said first I/O interface further comprises:

an enable path for providing enable signals to said data output path such that said array output signals can be controllably provided to the I/O terminal corresponding to the first I/O interface;

a third multiplexer having an output connected to said enable path of the first I/O interface, said third multiplexer further having a plurality of inputs; and a third I/O signal bus, the third I/O signal bus being connected between one of the switches of said first plurality of buses and one of the plurality of inputs of the third multiplexer of the first I/O interface.

6. The programmable array of claim 5 wherein the first I/O signal bus of said first I/O interface is connected to one of the plurality of outputs of the second multiplexer of the first I/O interface and to one of the plurality of inputs of the third multiplexer of the first I/O interface.

7. The programmable array of claim 5 wherein the second I/O signal bus of the first I/O interface is connected to one of the plurality of inputs of the first multiplexer of the first I/O interface and to one of the plurality of inputs of the third multiplexer of the first I/O interface.

8. The programmable array of claim 5 wherein the third I/O signal bus of the first I/O interface is connected to one of the plurality of inputs of the first multiplexer of the first I/O interface and to one of the plurality of outputs of the second multiplexer of the first I/O interface.

9. The programmable array of claim 5 wherein the first, second and third I/O signal buses are all connected to each of the first, second, and third multiplexers of the first I/O interface.

10. The programmable array of claim 9 wherein the corresponding one of the plurality of logic cells includes:
a first conductor connected to an input of the first multiplexer of the first I/O interface; and
a second conductor connected to the data input path of the first I/O interface.

11. The programmable array of claim 1 wherein the first I/O signal bus of the first I/O interface is connected to one of the plurality of outputs of the second multiplexer of the first I/O interface.

12. The programmable array of claim 1 wherein the second I/O signal bus of the first I/O interface is connected to one of the plurality of inputs of the first multiplexer of the first I/O interface.

13. The programmable array of claim 1 wherein the corresponding one of the plurality of logic cells includes:
a first conductor connected to an input of the first multiplexer of the first I/O interface; and
a second conductor connected to the data input path of the first I/O interface.

14. The programmable array of claim 1 wherein the programmable interconnect network further comprises a second plurality of buses wherein selected buses in the second plurality of buses are connectable to the ones of the plurality of logic cells, the second plurality of buses including a second plurality of switches, at least some switches of the second plurality of switches for programmably providing signals between buses of the second plurality of buses, wherein the programmable array further comprises:
a second I/O interface associated with the corresponding one of the plurality of logic cells, the second I/O interface comprising:
a data output path for carrying array output signals to an I/O terminal corresponding to the second I/O interface;
a data input path for carrying array input signals from the I/O terminal corresponding to the second I/O interface;
a first multiplexer having an output connected to said data output path, said first multiplexer further having a plurality of inputs;
a second multiplexer having an input connected to said data input path, said second multiplexer further having a plurality of outputs; and
first and second I/O signal buses, the first I/O signal bus being connected between one of the switches of the second plurality of buses and one of the plurality of inputs of the first multiplexer, the second I/O signal bus being connected between one of the switches of the second plurality of buses and one of the plurality of outputs of the second multiplexer.

15. The programmable array of claim 14 wherein the second I/O interface further comprises:
an enable path for providing enable signals to said data output path such that said array output signals can be controllably provided to the I/O terminal corresponding to the second I/O interface;
a third multiplexer having an output connected to said enable path of the second I/O interface, said third multiplexer having a plurality of inputs; and
a third I/O signal bus, the third I/O signal bus being connected between one of the switches of said second plurality of buses and one of the plurality of inputs of the third multiplexer of the second I/O interface.

16. The programmable array of claim 15 wherein the corresponding one of the plurality of logic cells includes:
a first conductor connected to an input of one of the first and third multiplexers of the first I/O interface and connected to an input of one of the first and third multiplexers of the second I/O interface; and
a second conductor connected to an input of one of the first and third multiplexers of the first I/O interface and connected to an input of one of the first and third multiplexers of the second I/O interface.

17. The programmable array of claim 16 wherein the corresponding one of the plurality of logic cells includes:
a third conductor connected to the data input path of the first I/O interface; and
a fourth conductor connected to the data input path of the second I/O interface.

18. The programmable array of claim 14 further comprising:
a plurality of I/O routing buses, said plurality of I/O routing buses running proximate said first and second I/O interfaces, at least one of said plurality of I/O routing buses being programmably connectable to at least one of the first and second I/O signal buses of the first and second I/O interfaces.

19. The programmable array of claim 18 further comprising programmable elements connected between the at least one of the plurality of I/O routing buses and the at least one of the first and second I/O signal buses of the first and second I/O interfaces.

20. The programmable array of claim 18 wherein the plurality of I/O routing buses runs generally along a perimeter of the array.

21. An I/O and interconnect system for a programmable array having a plurality of programmable logic cells, the I/O and interconnect system comprising:
an I/O terminal;
an I/O interface corresponding to said I/O terminal, said I/O interface including a first multiplexer connected thereto;
a general interconnect network for interconnecting the plurality of programmable logic cells, the general interconnect network comprising a first plurality of parallel interconnect buses, the first plurality of parallel interconnect buses including a first extended bus connected to the first multiplexer of the I/O interface; and
a plurality of perimeter buses, said plurality of perimeter buses running along a perimeter of the array, at least one of the plurality of perimeter buses being programmably connectable to the extended bus of the first plurality of parallel interconnect buses.

22. The programmable array of claim 21 wherein the I/O interface further includes:
an output path, wherein the first multiplexer has an output connected to said output path;
an input path;
a second multiplexer, wherein the second multiplexer has an input connected to said input path;
an output enable path; and
a third multiplexer, wherein the third multiplexer has an output connected to said output enable path.

23. The programmable array of claim 22 wherein the first plurality of parallel interconnect buses further includes second and third extended buses, the second extended bus being connected to an output of the second multiplexer of the I/O interface, the third extended bus being connected to an input of the third multiplexer of the I/O interface, selected buses of the plurality of perimeter buses being programmably connectable to a selected one of the first, second and third extended buses of the first plurality of parallel interconnect buses.

24. The programmable array of claim 23 wherein at least one of the plurality of programmable logic cells includes a direct connect output conductor connected to an input of the first multiplexer of the I/O interface.

25. The programmable array of claim 24 wherein at least one of the plurality of programmable logic cells includes a direct connect input conductor connected to the input path of the I/O interface.

26. The programmable array of claim 25 wherein each of the first, second and third extended buses of the first plurality of parallel interconnect buses is connected to each of the first, second and third multiplexers of the I/O interface.

27. The programmable array of claim 21 further comprising a programmable pass gate connected between the at least one of the plurality of perimeter buses and the first extended bus of the first plurality of parallel interconnect buses such that the buses can be programmably connected.

28. The programmable array of claim 27 wherein the plurality of perimeter buses includes a plurality of programmable switches connected therein such that a signal received from a first bus of said plurality of perimeter buses can be programmably provided to a second bus of said plurality of perimeter buses using at least one of said plurality of programmable switches.

29. The programmable array of claim 28 wherein the at least one of the plurality of programmable switches comprises a programmable switching repeater having four ports, each port being connected to a different bus of said plurality of perimeter buses such that a signal received at a first one of said ports of the programmable switching repeater can be programmably buffered and redriven to a second one of said ports of the programmable switching repeater.

30. The programmable array of claim 29 wherein the plurality of programmable switches comprises a plurality of generally regularly spaced programmable switching repeaters within said plurality of perimeter buses.

31. The programmable array of claim 28 wherein the array is quadrilateral in shape such that the perimeter of the array comprises four corners and wherein some of the plurality of programmable switches are positioned at each of said four corners.

32. The programmable array of claim 21 wherein the plurality of perimeter buses includes a plurality of repeaters connected therein, at least some of said plurality of repeaters for redriving signals within the plurality of perimeter buses.

33. A programmable array having a plurality of logic cells arranged in rows and columns therein including a plurality of perimeter logic cells, and a programmable interconnect network for interconnecting logic cells of the plurality of logic cells, the programmable interconnect network comprising a plurality of buses, at least some of the plurality of buses being generally associated with, and connectable to, respective ones of the plurality of logic cells, said programmable array further comprising:

a routing network disposed at the perimeter of the array, said routing network comprising a plurality of buses;

a plurality of I/O interfaces about the perimeter of the array, such that each of a portion of the plurality of perimeter logic cells has two I/O interfaces corresponding thereto;

a plurality of first conductors for programmably connecting at least some of the plurality of I/O interfaces to corresponding logic cells about the perimeter of the array;

a plurality of second conductors for programmably connecting the at least some of the plurality of I/O interfaces to corresponding ones of the plurality of buses of the programmable interconnect network; and a plurality of programmable connections for programmably connecting at least some of the plurality of buses of the routing network to at least some of the plurality of second conductors.

34. The programmable array of claim 33 wherein each of the at least some of the plurality of I/O interfaces comprises:

an output path;

an input path; and an output enable path.

35. The programmable array of claim 34 further comprising:

a first multiplexer connected to the output enable path of each of the at least some of the plurality of I/O interfaces, the first multiplexer for programmably selecting signals from a first and second conductor corresponding to the respective I/O interface;

a second multiplexer connected to the output path of each of the at least some of the plurality of I/O interfaces, the second multiplexer for programmably selecting signals from a first and second conductor corresponding to the respective I/O interface; and a third multiplexer connected to said input path for programmably applying a signal from said input path of each of the at least some of the plurality of I/O interfaces to a respective one of the plurality of second conductors.

36. The programmable array of claim 35 further comprising fixed logic inputs to at least one of the first and second multiplexers of each of the at least some of the plurality of I/O interfaces.

37. The programmable array of claim 33 wherein the routing network comprises a plurality of programmable switches, at least some of the plurality of programmable switches being programmable to provide signals between respective ones of the plurality of buses of the routing network.

38. The programmable array of claim 33 wherein the routing network comprises sixteen buses disposed about the entire perimeter of the array.

* * * * *